(12) United States Patent
Sekine et al.

(10) Patent No.: US 7,838,344 B2
(45) Date of Patent: Nov. 23, 2010

(54) METHOD FOR MANUFACTURING A CHARGE COUPLED DEVICE

(75) Inventors: Hirokazu Sekine, Kanagawa-ken (JP); Shu Sasaki, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 12/352,799

(22) Filed: Jan. 13, 2009

(65) Prior Publication Data
US 2009/0181501 A1    Jul. 16, 2009

(30) Foreign Application Priority Data
Jan. 16, 2008    (JP) ............... 2008-006992

(51) Int. Cl.
*H01L 21/339* (2006.01)
(52) U.S. Cl. .............. 438/144; 257/E31.075; 257/E31.081
(58) Field of Classification Search .......... 438/29, 438/32, 142, 144, 147; 257/E31.075, E31.078, 257/E31.081, E31.084
See application file for complete search history.

(56) References Cited
U.S. PATENT DOCUMENTS
4,842,633 A  *  6/1989  Kuribayashi et al. ........... 65/44

6,573,959 B1  *  6/2003  Molsen ..................... 349/113
7,176,074 B1     2/2007  Shiau et al.

FOREIGN PATENT DOCUMENTS
JP    5-267206    10/1993
JP    8-250446     9/1996

OTHER PUBLICATIONS
U.S. Appl. No. 12/796,065, filed Jun. 8, 2010, Sasaki.

* cited by examiner

*Primary Examiner*—Brook Kebede
(74) *Attorney, Agent, or Firm*—Oblon, Spivak, McClelland, Maier & Neustadt, L.L.P.

(57) ABSTRACT

A method for manufacturing a semiconductor device includes steps of forming an embedded channel 12 in a semiconductor substrate 11, forming a resist layer on the embedded channel 12 through an oxide film 14, exposing the resist layer using a grating mask the light transmissivity of which varies toward transfer directions of electric charges, developing the exposed resist layer to form a resist mask having a gradient, forming a first impurity region 13 having a concentration gradient by injecting ions into the embedded channel 12 through the resist mask, and arranging transfer electrodes 15 at prescribed positions on the first impurity region 13 through the oxide film 14 after removing the resist mask, wherein a potential profile becomes deeper toward the transfer directions of the electric charges.

11 Claims, 8 Drawing Sheets

METHOD FOR MANUFACTURING A CHARGE COUPLED DEVICE

CROSS-REFERENCE TO RELATED APPLICATIONS

This application is based upon and claims the benefit of priority from prior Japanese Patent Application No. 2008-006992, filed Jan. 16, 2008, the entire contents of which are incorporated herein by reference.

BACKGROUND OF THE INVENTION

This invention relates to a method for manufacturing a semiconductor device. More specifically, the present invention relates to a method for manufacturing a charge-coupled device (CCD) in which impurity regions, having a concentration gradient aligned with the transfer direction of electric charges, is formed.

In a conventional CCD, an embedded channel, which is a region for transferring the charges, is formed in a semiconductor substrate, and a plurality of transfer electrodes extending in directions crossing the transfer direction of the charges are arranged at prescribed intervals on a surface of the channel. In the embedded channel under each transfer electrode, impurity regions are formed, each having a concentration gradient forming an energy potential which deepens as it progresses toward the transfer direction of the charges. Therefore, the charges are always localized in the regions at a deeper potential, thereby the charge transfer at high speed and high efficiency may be achieved.

With respect to a method for manufacturing the impurity regions having such a concentration gradient, the following method has been known. With the method, a resist film is softened through a reflow process forming a mask having a gradient providing edge by utilizing the surface tension of the softened resist film, and impurities are injected into the semiconductor substrate through the mask. In such way, the concentration of a single impurities having the desired gradient is provided with the impurity injection (refer to a patent document 1: Jpn. Pat. Appln. KOKAI Publication No. 5-267206).

However, the conventional method for manufacturing the CCD poses the following problem.

That is, since it is formed through the surface tension in the reflow process, the shape of the resist film forming the gradient is always upward convex. Further, it has been impossible to form the resist film having the gradient over a longer length, since only the end portions of the resist film may provide the gradient. As a result, it has been impossible to form the impurity region having the concentration gradient over the longer length. In this way, the foregoing method for manufacturing the impurity regions restricts the structure of the resist film mask to be formed, and may not form impurity regions having the various desired concentration profiles.

BRIEF SUMMARY OF THE INVENTION

One of the objects of the present invention is to provide a method for manufacturing a semiconductor device for forming an impurity region providing a desired concentration profile.

According to one embodiment of the present invention, there is provided a method for manufacturing a semiconductor device, includes steps of forming an embedded channel in a semiconductor substrate, forming a resist layer on the embedded channel through an oxide film, exposing the resist layer by using a grating mask in which the light transmissivity varies toward transfer directions of electric charges, developing the exposed resist layer to form a resist mask with a gradient, forming a first impurity region by injecting ions into the embedded channel through the resist mask, and forming transfer electrodes at prescribed positions on the first impurity region through the oxide film after removing the resist mask, wherein the first impurity region is formed in such a manner that a potential profile of the first impurity region deepens as it progresses in the transfer direction of the electric charges.

According to an embodiment of the present invention, it is possible to provide the method for manufacturing the semiconductor device which provides the impurity regions having the various desired concentration profiles.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

Hereinafter, embodiments of the invention will be described in details with reference to the drawings.

First Embodiment

Figure 1A:
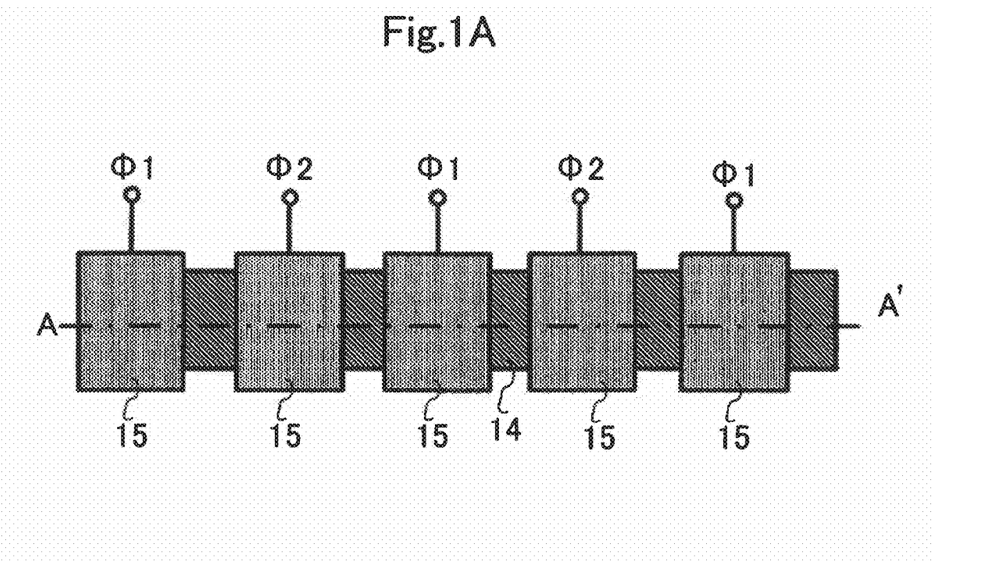
FIG. 1A is an exemplary plan view showing an electric charge transfer unit in a CCD according to a first embodiment of the invention.
Figure 1B:
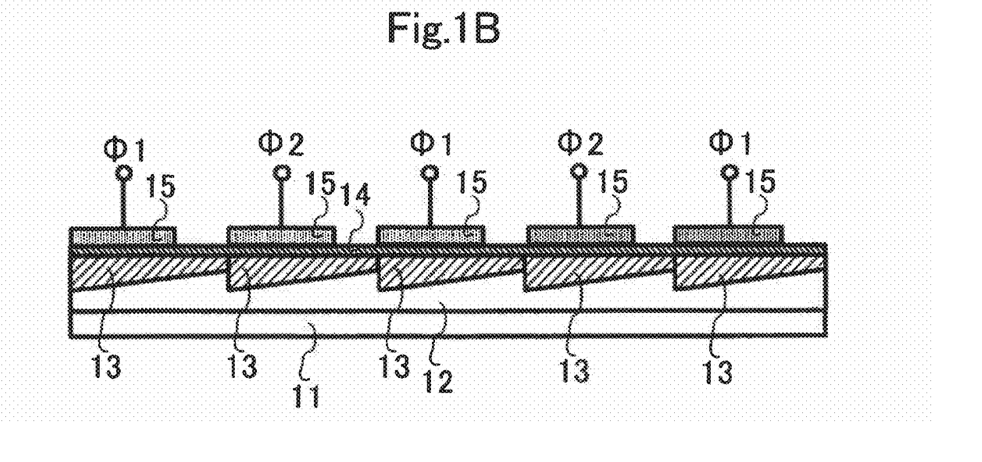
FIG. 1B is an cross-section view taken along dashed line A-A' in FIG. 1A.

FIG. 1A shows an plan view showing an electric charge transfer unit in a CCD according to a first embodiment of the invention, and FIG. 1B shows a cross-section view taken along dashed line A-A' of FIG. 1A.

As shown in FIGS. 1A and 1B, in the charge transfer unit of the CCD, an n-type embedded channel 12 is formed in a p-type semiconductor substrate 11. Then, a plurality of n+ type impurity regions 13 are formed in the channel 12. These impurity regions 13 have concentration gradients so that the concentration deepens as it progresses toward transfer direction of electric charges. Focusing on arbitrary two impurity regions 13 adjacent to each other, the portion having the highest concentration in the impurity region 13, and the portion having the lowest concentration in the impurity region 13 out of the two regions 13 are adjacent to each other. Transfer electrodes 15 are arranged on the surface of each of the impurity regions 13 through an oxide film 14. The transfer electrodes 15 are made of conductive material in a rectangular shape including two sides extending in directions intersecting with the transfer directions of the charges. The electrodes 15 are arranged at prescribed intervals to the adjacent transfer electrodes 15 so that one of the two sides, extending in directions perpendicular to the transfer direction of the charges, are placed in portions having the highest concentrations in the impurity regions 13. As a result, the other two sides are end up in front of the portions having the lowest concentration in the impurity regions 13.

Figure 2A:
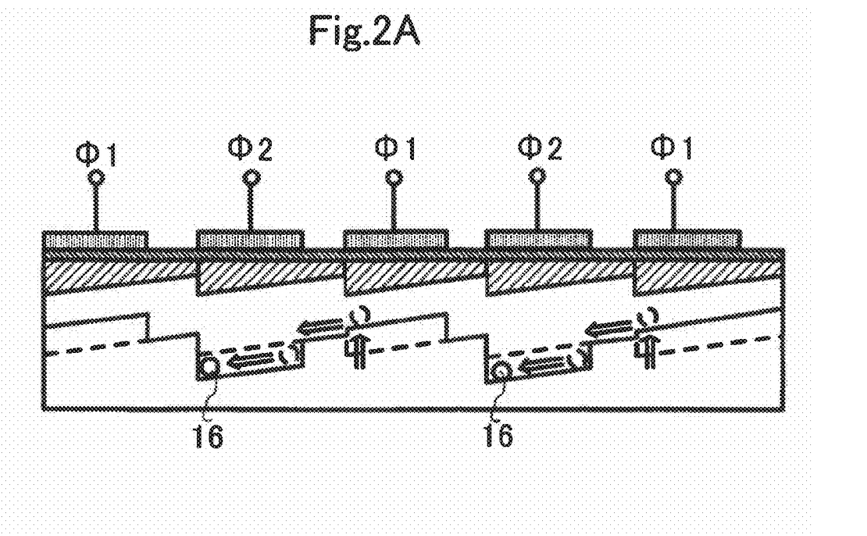
FIGS. 2A and 2B are exemplary views for explaining operations of the charge transfer units of the CCDs depicted in FIGS. 1A and 1B.
Figure 2B:
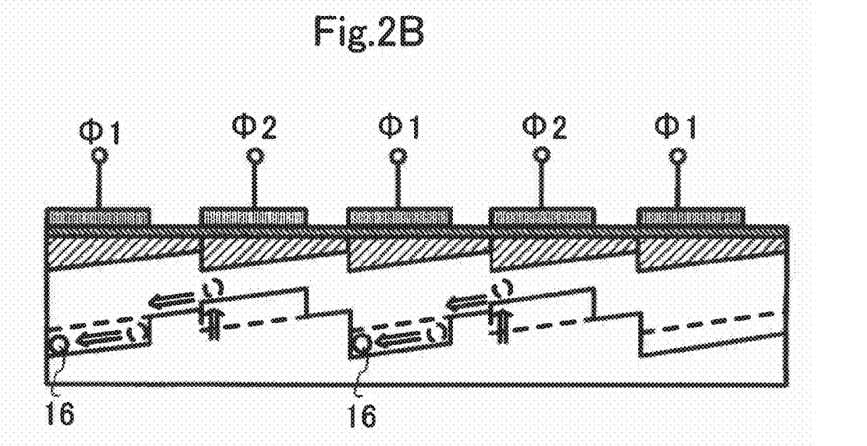

Next, operations of the charge transfer unit of the CDD structure as mentioned above will be described by referring to FIGS. 2A and 2B. FIG. 2A shows a potential profile in the regions under the transfer electrodes 15 in a case where a clock pulse of a negative voltage is applied to a terminal Φ1 and a clock pulse of a positive voltage is applied to a terminal Φ2, respectively. FIG. 2B shows a potential profile under the transfer electrodes 15 in a case where a clock pulse of a positive voltage is applied to the terminal Φ1 and a clock pulse of a negative voltage is applied to the terminal Φ2, respectively. In FIGS. 2A and 2B, doted lines indicate a potential profile when the clock pulses are not supplied, and full lines indicate a potential profile when the clock pulses are supplied.

At first, as shown in FIG. 2A, when clock pulses of negative voltages are supplied to the transfer electrodes 15 connected to the terminals Φ1, and when clock pulses of positive voltages are supplied to the transfer electrodes 15 connected to the terminals Φ2, the potentials under the electrodes 15 connected to the terminals Φ2 are shallow, and the potentials under the electrodes 15 connected to the terminals Φ1 are deep. At this moment, electric charges 16 are localized in the impurity regions 13 formed under the electrodes 15 connected to the terminals Φ2, since potential wells are formed under the electrodes 15.

In this state, as shown in FIG. 2B, when the clock pulses of the positive voltages are supplied to the electrodes 15 connected to the terminal Φ1, and the clock pulses of the negative voltages are supplied to the electrodes 15 connected to the terminals Φ2, the potentials under the electrodes 15 connected to the terminals Φ1 become deep, and the potentials under the electrodes 15 connected to the terminals Φ2 become shallow. At this moment, the charges 16 which have been localized in the impurity regions 13 formed under the electrodes connected to the terminals Φ2 are transferred to the impurity regions 13 formed under the electrodes 15 connected to the terminal Φ1, since the potential wells are formed under the electrodes 15 connected to the terminals Φ1. Here, it is possible for the charge transfer unit of the CCD to transfer the charges 16 at high speed and with high efficiency, since the charges 16 to be transferred are always localize in regions having deep potentials. Repeating the operations mentioned above transfers the charges 16.

Next, a method for manufacturing the CCD of the first embodiment shown in FIG. 1 will be described with reference to FIGS. 3-9. Any of FIGS. 3-9 excluding FIGS. 6 and 8 show cross-dimension views taken along the dashed line A-A' of FIG. 1A.

Figure 3:
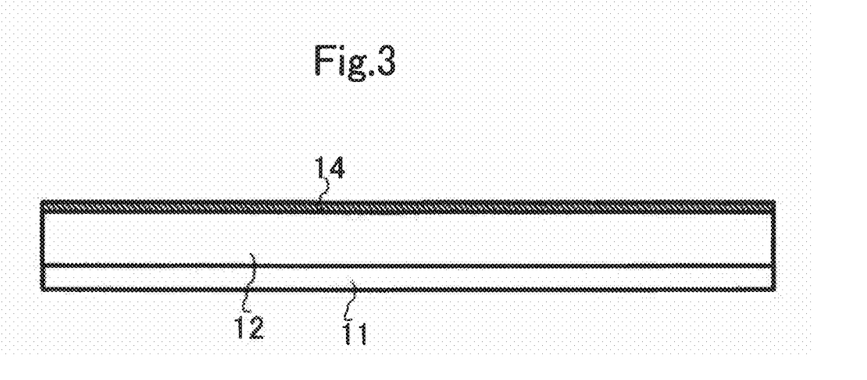
FIG. 3 is an exemplary view for explaining a method for manufacturing the charge transfer units depicted in FIGS. 1A and 1B.

At first, as shown in FIG. 3, the oxide film 14 is formed on the semiconductor substrate 11 with the n-type embedded channel 12 formed thereon.

Figure 4:
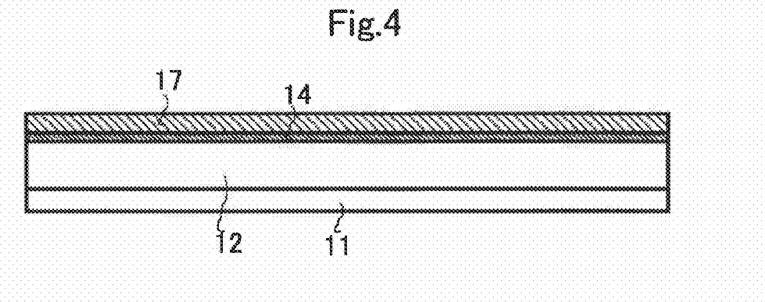
FIG. 4 is another exemplary view for explaining the method for the manufacturing the charge transfer units depicted in FIGS. 1A and 1B.

Subsequently, as shown in FIG. 4, the resist layer 17 to be the mask for forming the impurity regions 13 is formed evenly.

Figure 5:
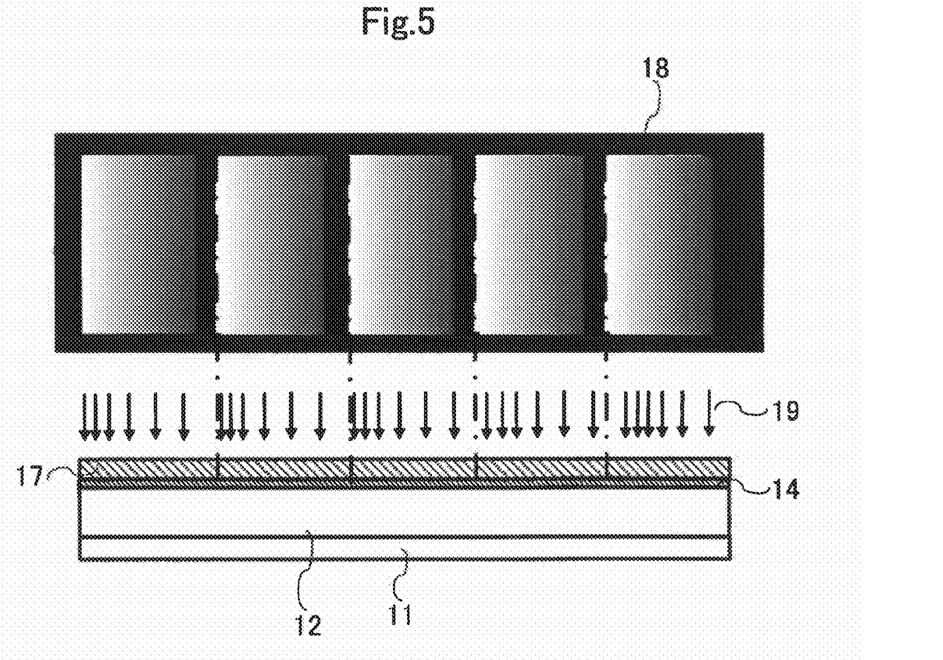
FIG. 5 is an exemplary view for explaining an plan view showing a grating mask to be used in a manufacturing process of the charge transfer units depicted in FIGS. 1A and 1B, and an exemplary view for explaining an exposure step using the grating mask.
Figure 6:
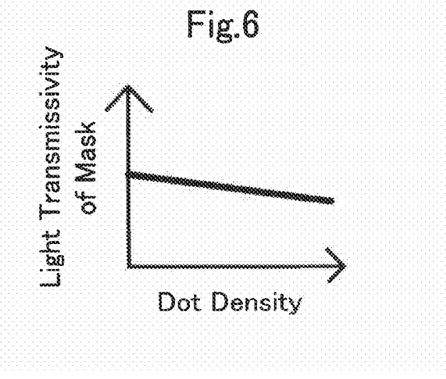
FIG. 6 is an exemplary view for explaining relations between the dot density of the grating mask depicted in FIG. 5 and light transmissivity of the mask.

Then, as shown in FIG. 5, in the method for manufacturing the CCD, the resist layer 17 is exposed by using the grating mask 18 in which dots are so formed that the light transmissivity level gradually strengthens along the transfer direction of the charged 16. The mask 18 is composed of a plurality of unit lengths arranged along the transfer directions of the charges 16. In the mask 18, the light transmissivity level gradually strengthens along the transfer direction of the charges 16 within the range of each unit length. FIG. 6 shows relations between transmissivity of light 19 and density of dots at each unit length of the mask 18. As shown in FIG. 6, an exposure amount of the resist layer 17 becomes small, since the thicker the dots become, the lower the transmissivity of the mask 18 becomes.

Figure 7:
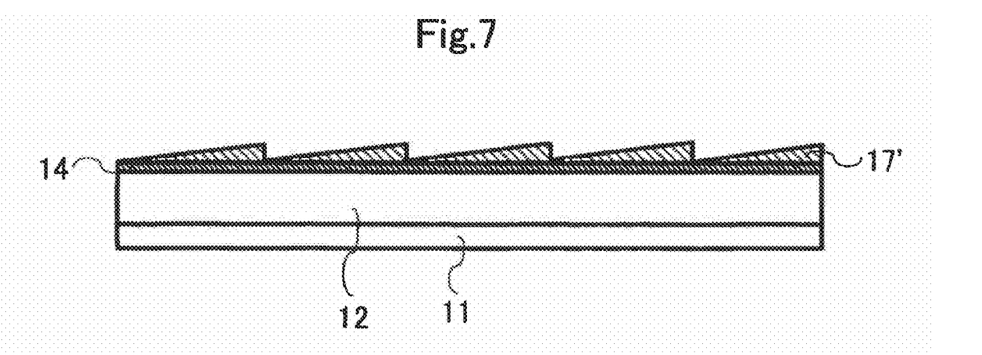
FIG. 7 is an exemplary view for further explaining the method for manufacturing the charge transfer units depicted in FIGS. 1A and 1B.
Figure 8:
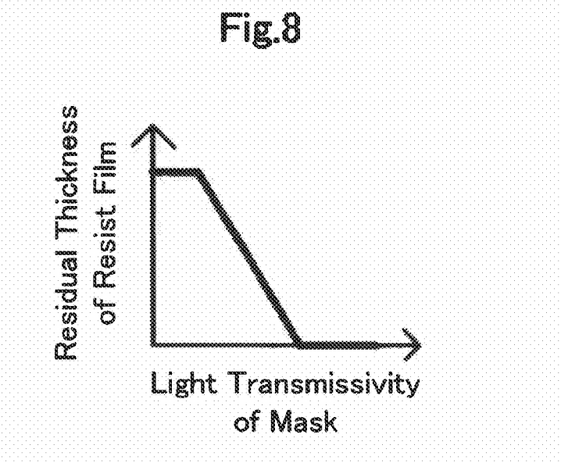
FIG. 8 is an exemplary view for explaining relations between the light transmissivity to a resist layer depicted in FIG. 7 and a resist residual film thickness.

Next, as shown in FIG. 7, the exposed resist layer 17 is developed. FIG. 8 shows relations between the amount of exposure for the resist layer 17 and the residual film thickness of the resist layer 17 in developing process. As shown in FIG. 8, the more the exposure amount for the resist layer 17 increases, the thinner the residual film thickness of the resist layer 17 after the developing process. Therefore, according to the method, the resist mask 17' can be formed to have gradients corresponding to changes in the density of dots in the grating mask 18. The resist mask 17' is composed of a plurality of unit lengths arranged along the transfer directions of the charges 16 in response to the grating mask 18, the thickness of which is gradually decreased along the transfer directions of the charges 16 within a range of each unit length.

Figure 9:
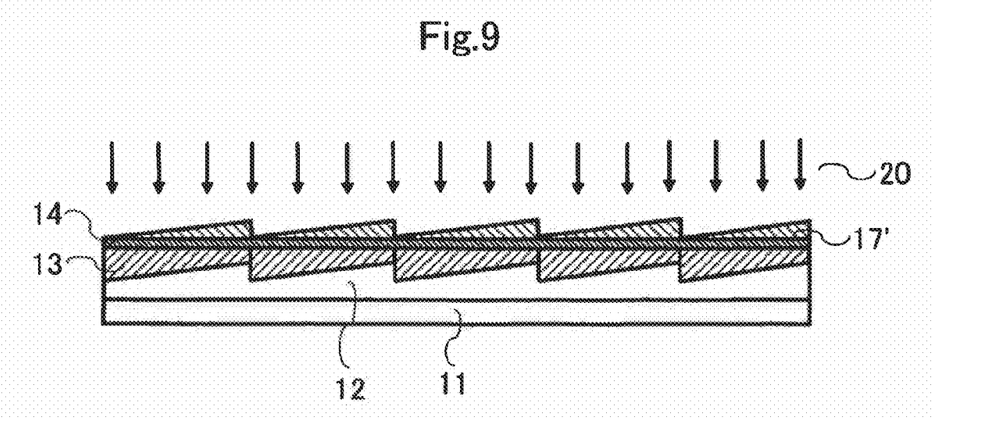
FIG. 9 is an exemplary view for further explaining the method for manufacturing the charge transfer units depicted in FIGS. 1A and 1B.

Then, as shown in FIG. 9, n-type ions 20 are injected into the embedded channel 12 through the resist masks 17' having the gradients. Here, impurity regions 13 possesing the same concentration gradients as those of the resist mask 17' are formed with an injection step, since portions of the resist mask 17' are thicker, the amount of the ions 20 injected is smaller. The impurity regions 13 are composed of a plurality of unit lengths arranged along the transfer directions of the charges 16 in response to the grating mask 18, the thickness of which is gradually decreased along the transfer directions of the charges 16 within a range of each unit length.

Finally, the CCD shown in FIG. 1 is manufactured by arranging the transfer electrodes 15 at prescribed positions after removing the resist mask 17' having the gradients.

As described in the above embodiment, according to the method for manufacturing the CCD, the impurity regions 13 having long gradients under the transfer electrodes 15 is formed by injecting the ions 20 through the resist mask 17', which has the gradients corresponding to the change in density of dots of the grating mask 18. With the method for forming the impurity regions 13, the electric charge transfer unit having the transfer electrodes 15 with long widths, or with longer intervals. Therefore, it is possible to reduce the number of the transfer electrodes 15 needed to transfer the charges 16 at high speed and with high efficiency, and to decrease consumed electric power of a clock driver supplying the clock pulses to the transfer electrodes 15, even when the transfer lengths of the charges 16 are long.

In the embodiment, since the impurity regions 13 are of n-type impurity regions, the grating mask 18 has been used, the light transmissivity for which increases along the transfer direction of the charges 16. However, in case the impurity regions 13 are of p-type, the grating mask 18 may be used, the light transmissivity for which decreases along the transfer direction of the charges 16. It is possible to form potentials which deepen as they progress toward the transfer directions of the charges 16 by injecting the ions 20 through the resist layer 17 which has been formed by exposing and developing it through grating mask 18.

Figure 10:
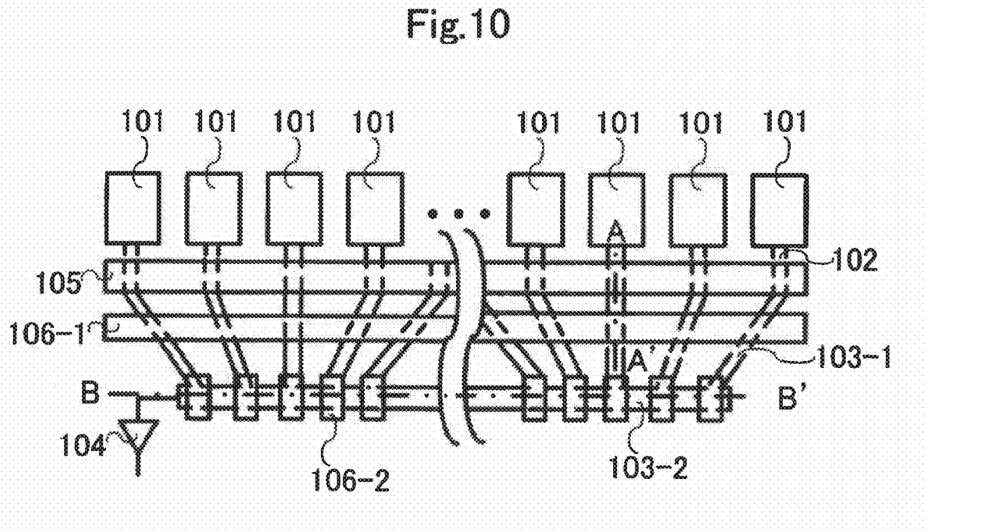
FIG. 10 is an exemplary plan view showing a part of a CCD image sensor using the charge transfer units depicted in FIGS. 1A and 1B.

The CCD of the first embodiment described above may be used at a various parts of the CCD image sensor, for example. FIG. 10 shows a plan view of the CCD image sensor using the CCD of the first embodiment. The image sensor shown in FIG. 10, which is embedded in the semiconductor substrate 11, includes a plurality of photoelectric transducers 101 for converting the received light into electric charges, a plurality of reading gates 102 for reading the charges generated from the transducers 101 and embedded channels 103 that are paths for transferring the charges which have been read by the gates 102. The embedded channels 103 are composed of a plurality of vertical transfer channels 103-1 for transferring the charges read by each reading gate 102 and a horizontal channel 103-2 for transferring the charges transferred by the transfer channels 103-1 to an output circuit 104.

Such a CCD image senor reads the charges generated from each transducer 101 to the reading gates 102 connected to each transducer 101, when pulses are applied to a reading gate electrode 105 arranged on the plurality of the gates 102. The read charges 16 move in the vertical transfer channels 103-1 when the pulses are applied to a vertical transfer electrode 106-1 arranged on the channels 103-1 connected to each gate 102, and transferred to a horizontal transfer channel 103-2. The charges transferred to the transfer channel 103-2 move in the transfer channel 103-2 when the pulses are applied to a plurality of horizontal transfer electrodes 106-2 arranged on the upper parts of the channel 103-2, and are transferred to the output circuit 104.

Figure 11:
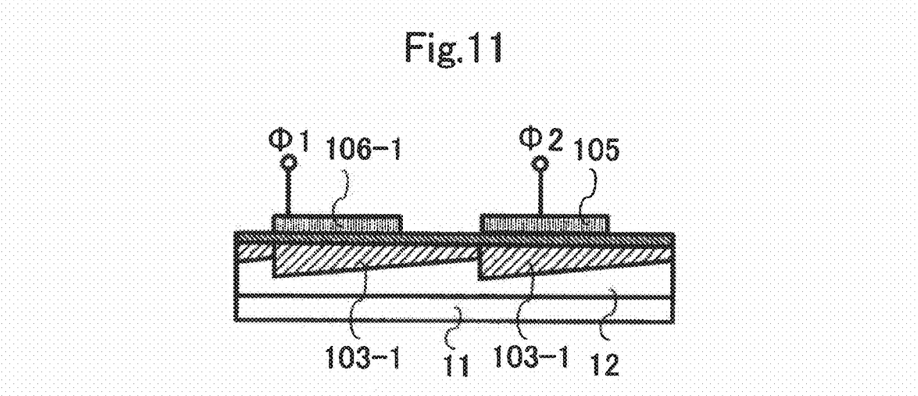
FIG. 11 is an exemplary cross-sectional view of a vertical transfer channel along the dashed line A-A' of FIG. 10.
Figure 12:
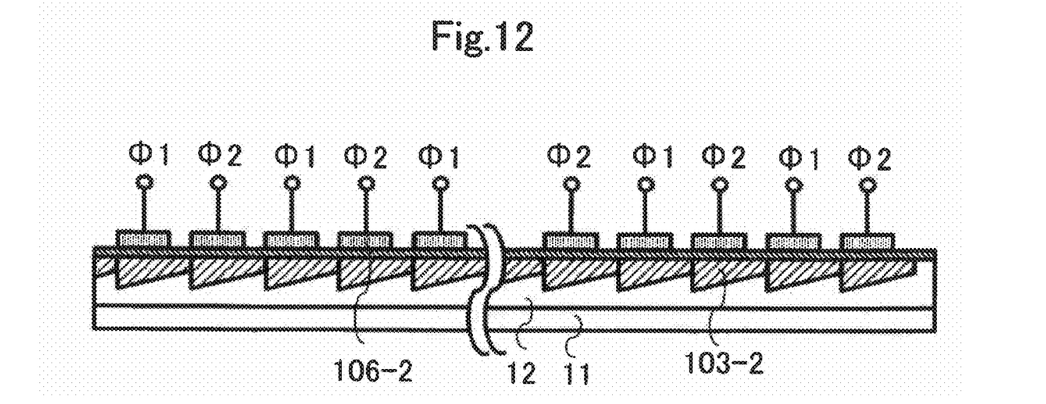
FIG. 12 is an exemplary cross-sectional view of a horizontal transfer channel along a dashed line B-B' of FIG. 10.

In such a CCD image sensor, the charge transfer unit in the CCD of the first embodiment may be used for the vertical transfer unit and the horizontal transfer unit. FIG. 11 shows a cross-section view of a vertical transfer unit along a dashed line A-A' of FIG. 10. FIG. 12 shows a cross-section view of a horizontal transfer unit along a dashed line B-B' of FIG. 10.

As shown in FIGS. 11 and 12, using the charge transfer unit according to the first embodiment for the vertical transfer channels 103-1 and for the horizontal transfer channel 103-2 enables transferring the charges 16 with low electric power consumed at high speed and with high efficiency. Since it is possible to transfer the charges 16 with high efficiency, it is not necessary to increase an amount of saturated electric charge by spreading the channel widths of the transfer channels 103 toward the transfer directions of the charges 16 as is seen in conventional devices. Since it is possible to form the transfer channels 103 with a constant width, the transfer channels may be easily designed according to the embodiment of the present invention. Further, as shown in FIG. 10, even when there is difference in transfer path length of charges 16, it is also possible to prevent a delay due to a difference in transfer time of the charges 16, since it is possible to transfer the charges 16 at high speed by forming the impurity regions 13 so that a longer transfer path has a sharper impurity gradient than a shorter transfer path with a gradual impurity gradient.

In the method for manufacturing a semiconductor device described with reference to FIG. 11 or FIG. 12, an additional implanting process may be provided, in which ions or impurities having a different conductivity type from those of injected into the vertical transfer channels 103-1 (FIG. 11) or horizontal transfer channel 103-2 (FIG. 12) are injected into the channel regions through such gap portions as formed between the reading gate electrode 105 and the vertical transfer electrode 106-1 in the vertical transfer channels 103-1 or between the horizontal transfer electrodes 106-2 in the horizontal transfer channel 103-2 to form impurity regions (not shown) having a substantially constant depth with respect to the transfer direction of the charges in the transfer channels. With the impurity regions formed (not shown), transfer efficiency is further improved by preventing the potential well from shifting due to the gap portions not covered by transfer electrodes.

Second Embodiment

Figure 13A:
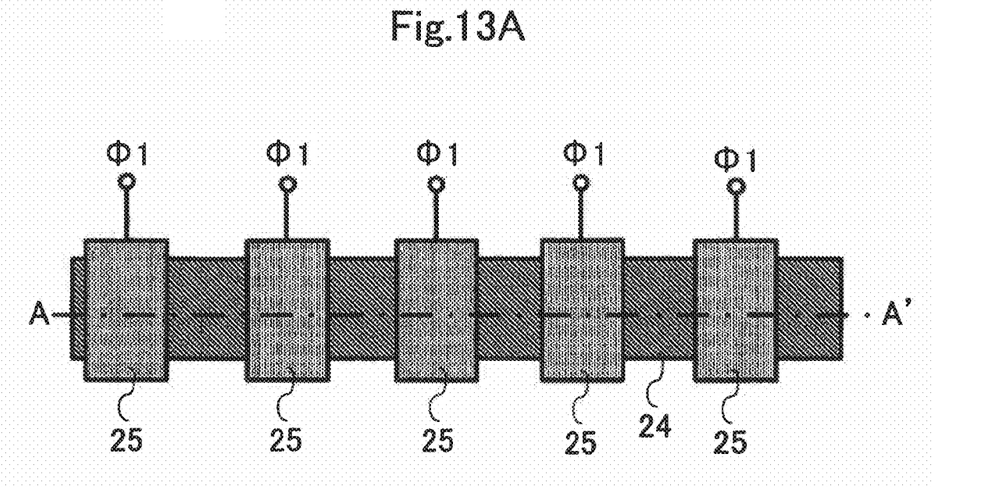
FIG. 13A is an exemplary plan view of an electric charge transfer unit in a CCD of a second embodiment of the invention.
Figure 13B:
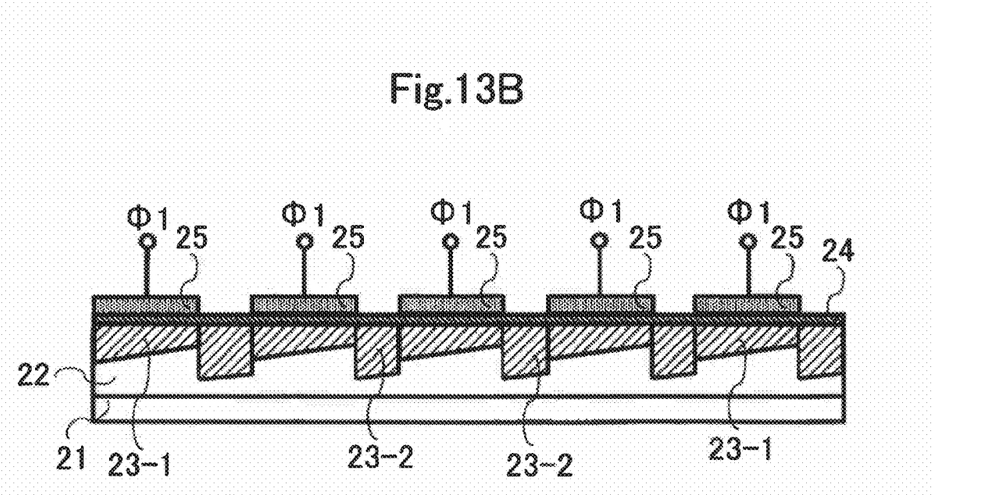
FIG. 13B is an exemplary cross-sectional view along the dashed line A-A' of FIG. 13A.

FIGS. 13A and 13B show electric charge transfer unit of a CCD in a second embodiment of the invention, FIG. 13A shows the plan view of the transfer unit, and FIG. 13B shows a cross-sectional view taken along a dashed line A-A' of the FIG. 13A.

In the transfer units shown in FIGS. 13A and 13B, an n-type embedded channel 22 is formed on the surface of a p-type semiconductor substrate 21. Further, a plurality of first n+ type impurity regions 23-1, having gradients making concentrations thick toward transfer directions of charges 16, are formed. Further, between the first impurity regions 23-1, second n+ type impurity regions 23-2 having the same concentration gradients as those of the first impurity regions 23-1 are formed, and the first regions 23-1 and the second regions 23-2 are adjoined. An oxide film 24 is formed on the first and the second impurity regions 23-1 and 23-2, and transfer electrodes 25 are arranged at prescribed intervals on the first impurity regions 23-1 through the oxide film 24. The electrodes 25 are formed in rectangular shapes having two sides extending in directions intersecting with the transfer directions in the same manner as those of the electrodes 25 in the first embodiment.

Figure 14A:
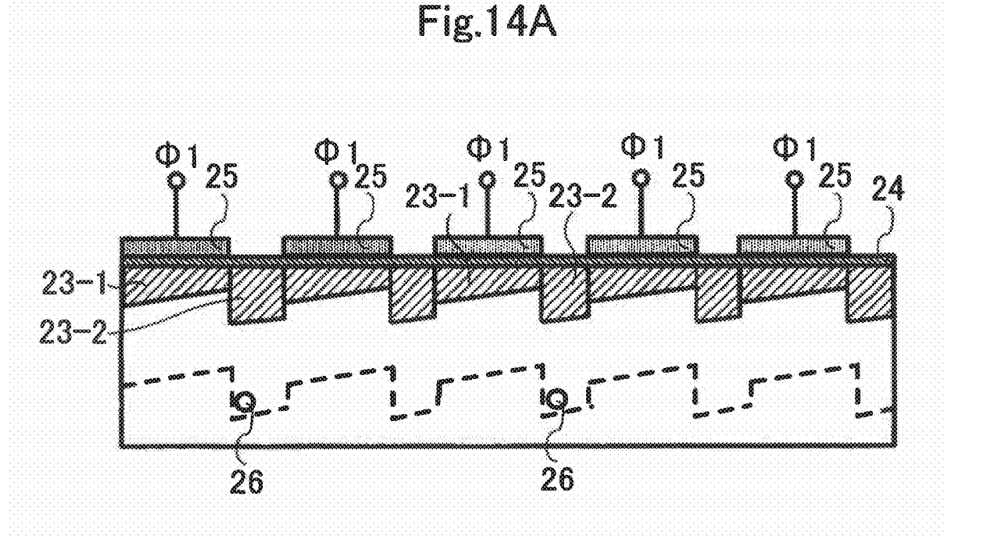
FIGS. 14A and 14B are exemplary views for explaining operations of the charge transfer units depicted in FIGS. 13A and 13B.
Figure 14B:
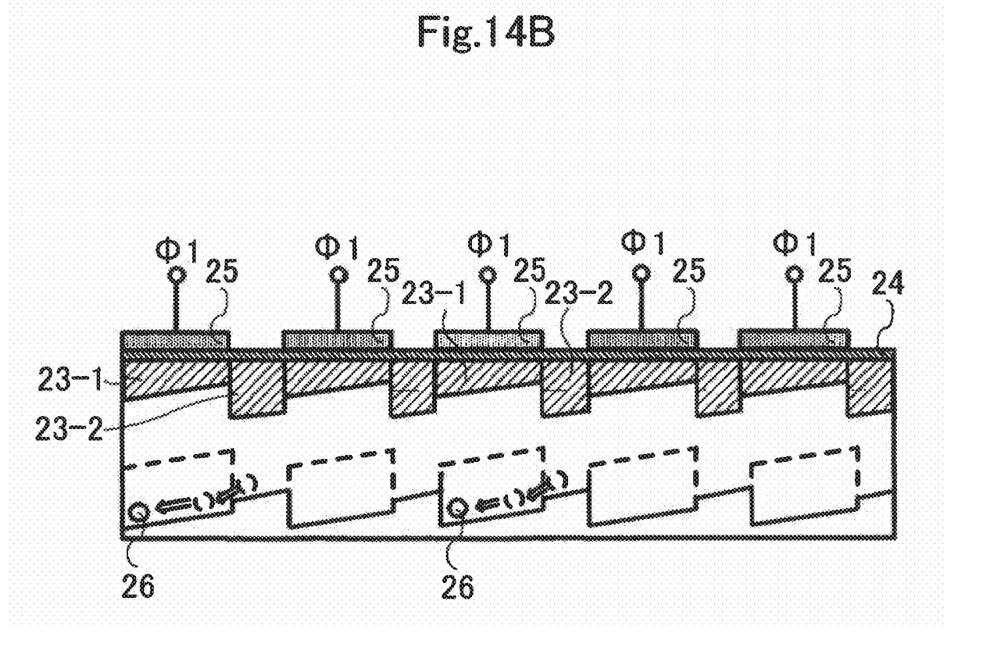

Operations of the electric charge transfer unit in the CCD of the second embodiment will be described with reference to FIGS. 14A and 14B. In the second embodiment, the transfer unit does not perform the so-called two-phase drive in the first embodiment, but performs a so-called single-phase drive which operates by a one-phase drive clock. FIGS. 14A and 14B show potentials to be formed in the CCD of the second embodiment in cross-sectional views, which corresponds to FIG. 13B. That is, FIG. 14A shows a potential profile when clock pulses are not supplied to the transfer electrodes 25, and FIG. 14B shows a potential profile when clock pulses of positive voltages are supplied to the transfer electrodes 25. In these FIGS. 14A and 14B, doted lines indicate the potential profile before the voltages are not applied, and full lines indicate the potential profile when the voltages are applied.

At first, as shown in FIG. 14A, when the clock pulses are not applied, the charges 26 which have been localized in the first impurity regions 23-1 formed under the transfer electrodes 25 are transferred to the second impurity regions 23-2 formed between the transfer electrodes 25. In this state, as shown in FIG. 14B, when the clock pulses of the positive voltages are supplied to the terminals Φ1, the potential under the electrodes 25 is formed deeply. Therefore, the charges 26 which have been localized in the second impurity regions 23-2 are transferred so as to be drawn into the first impurity regions 23-1. Even in the CCD according to the second embodiment, it is possible to produce the same effect as that of the first embodiment. In the second embodiment, it is possible to simplify a circuit of the clock driver and drive timing supplying the clock pulses in comparison with the first example, since the charge transfer unit performs the single-phase drive.

The method for manufacturing the CCD according to the second embodiment is almost the same as that of the first embodiment. According the latter method, however, a process of injecting ions by using the transfer electrodes 25 as masks after forming the transfer electrodes 25 is further included.

While the CCD and the method for manufacturing therefore in the aforementioned embodiments have been described, the invention is not limited to these embodiments.

Figure 15:
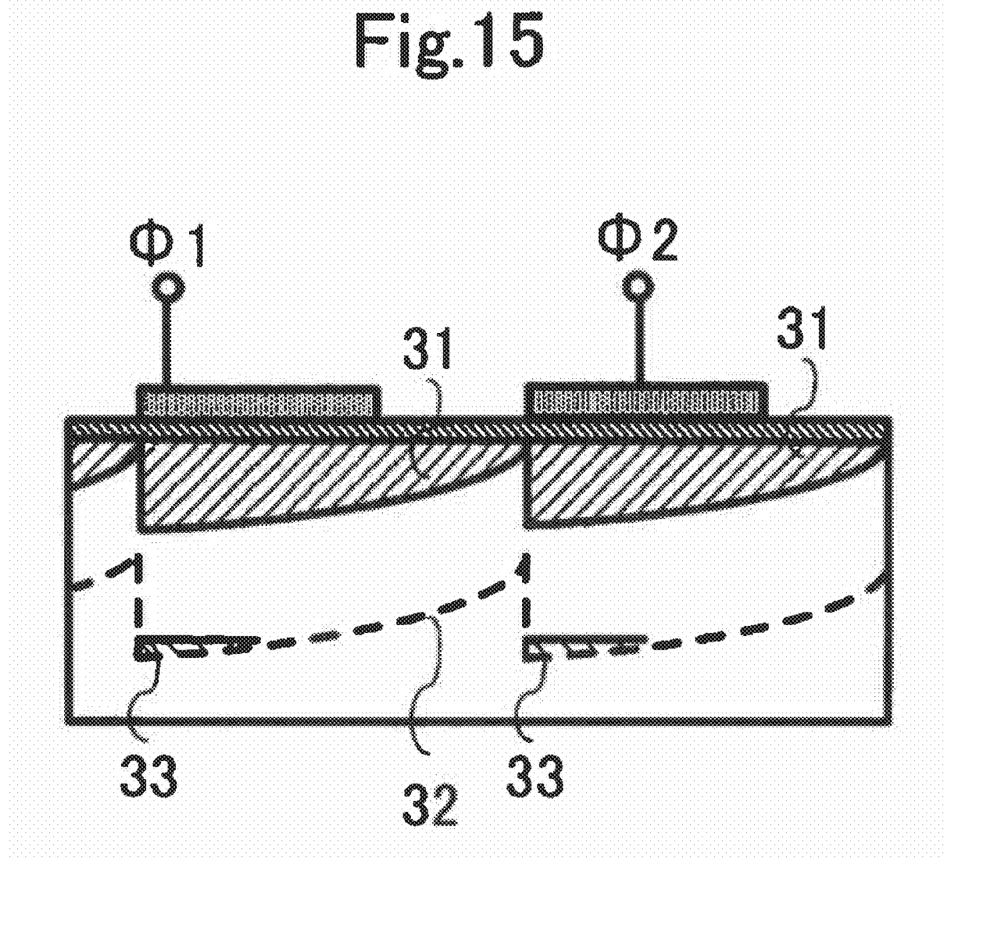
FIG. 15 is an exemplary view for explaining a potential profile under electrodes of the charge transfer units depicted in FIGS. 13A and 13B.

For instance, in each of the foregoing embodiments, the light transmissivity of the grating masks 18 is varied at constant rates, so that the first impurity regions 13 (23-1) having the constant gradients is formed. However, the method for forming the resist masks 17' using the grating masks 18 having the dots may form the resist masks 17' in desired shapes by deciding the dot density as desired. Therefore, according to the method for forming the first impurity regions 13 (23-1) shown in the aforementioned embodiments, the impurity regions 12 (23-1) having desired concentration profiles may be formed by injecting ions at a time. For instance, as shown in FIG. 15, it is also possible to form impurity regions 31 having a concentration profile. With forming such impurity regions 13, regions with deep potentials are widely formed since the potential profiles 32 is formed in convex shape toward under. Thus, the amount of the saturated electric charge can be made high, since the number of electric charges 33 localized in the regions of the deep potential is increased. It is also possible to narrow the channel width, thereby miniaturizing the CCD.

While in the above embodiments, the resist masks having the gradients are formed by using the grating masks having the dots, any mask may be used with the same effect as long as grating masks with differing light transmissivity from point to point.

Although the aforementioned embodiments have described the embedded channels and the first impurity regions of conductivity types of n-types, and have described the second impurity regions of conductivity types of p-types, the channel regions and the impurity regions may have any conductive type as long as the potential profiles to be formed by the concentration profiles of the first and the second impurity regions are potential profiles having the gradients which deepen as they progress toward the transfer directions of the charges. However, it is necessary to supply clock pulses which are appropriate for each electrode, since the potential profiles to be formed vary according to the combination of conductivity types in the impurity regions.

While in the first embodiments described, positive and negative clock pulses of opposite phases are alternatively supplied at the same timing to the transfer electrodes consecutively arranged, two kinds of clock pulses differing in voltage level may be similarly supplied at the same timing.

While the methods for forming the impurity regions in the CCD is described in the above embodiments, the present invention is applicable to any semiconductor device as long as a semiconductor device with impurity regions having concentration gradients are formed therein. For instance, the method according to the embodiments described above is applicable to the method for manufacturing a MOS transistor having three transfer electrodes, which correspond to a drain electrode, a gate electrode and a source electrode respectively. That is, it is possible to form the impurity regions under the gate electrodes having the same concentration gradients as described in the embodiment in the same way. In this case, the impurity regions to be formed under the drain electrodes and the source electrodes respectively are not limited to the impurity regions having the concentration gradients.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising steps of:
   forming an embedded channel in a semiconductor substrate;
   forming a resist layer on the embedded channel through an oxide film;
   exposing the resist layer through a grating mask with a light transmissivity which varies along transfer directions of electric charges;
   developing the exposed resist layer so as to form a resist mask having a gradient;
   forming a first impurity region by injecting ions into the embedded channel through the resist mask; and
   forming transfer electrodes through the oxide film at prescribed positions on the first impurity region after removing the resist mask, wherein
   the first impurity region is so formed that a potential profile of the first impurity region deepens as it progresses toward the transfer directions of the electric charges.

2. The method according to claim 1, wherein a conductive type of the semiconductor substrate including well regions formed on a main surface of the semiconductor substrate is a p-type, and conductive types of the embedded channel and the first impurity regions are n-types.

3. The method according to claim 2, wherein the grating mask is composed of a plurality of unit lengths arranged along the transfer directions of the electric charges, and the light transmissivity varies so as to increase along the transfer directions of the electric charges in a range of each unit length.

4. The method according to claim 2, wherein the grating mask is a mask which controls the light transmissivity of a position of the mask by means of dot density.

5. The method according to claim 4, wherein the resist mask is composed of a plurality of unit lengths arranged along the transfer directions of the electric charges, and the thickness of the resist mask varies so as to be gradually thinner along the transfer directions of the electric charges in a range of each unit length.

6. The method according to claim 3, wherein the first impurity region is composed of a plurality of unit lengths arranged along the transfer directions of the electric charges, a thickness of the first impurity region varies so as to become gradually thick toward the transfer directions of the electric charges in a range of each unit length.

7. The method according to claim 6, wherein the transfer electrodes are arranged for each unit length forming the first impurity region, and spaces are formed between adjacent electrodes by making the lengths of the transfer electrodes along the transfer directions of the electric charges shorter than the unit length.

8. The method according to claim 7, wherein the transfer electrodes are formed in rectangular shapes each having two parallel sides intersecting with the transfer directions of the electric charges, and are arranged so that each one side of the parallel two sides coincides with a part at which a thickness of the first impurity region becomes maximized.

9. The method according to claim 1, further comprising steps of:

forming a second impurity region by injecting ions into the first impurity region using the transfer electrodes as masks after forming the transfer electrodes.

10. The method according to claim 9, wherein a conductive type of the second impurity region is a p-type.

11. The method according to claim 1, wherein the transfer electrodes are gates of MOS transistors, and the embedded channel is a channel impurity region to be formed under the gates.

* * * * *